(12) United States Patent
Lin et al.

(10) Patent No.: US 8,976,529 B2
(45) Date of Patent: Mar. 10, 2015

(54) LID DESIGN FOR RELIABILITY ENHANCEMENT IN FLIP CHIP PACKAGE

(75) Inventors: Wen-Yi Lin, Wugu Township (TW);
Po-Yao Lin, Zhudong Township (TW);
Tsung-Shu Lin, Yonghe (TW);
Kuo-Chin Chang, Hsin-Chu (TW);
Shou-Yi Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 228 days.

(21) Appl. No.: 13/007,249

(22) Filed: Jan. 14, 2011

(65) Prior Publication Data
US 2012/0182694 A1  Jul. 19, 2012

(51) Int. Cl.
*H05K 7/20* (2006.01)
*H01L 23/16* (2006.01)
*H01L 23/055* (2006.01)
*H01L 23/00* (2006.01)

(52) U.S. Cl.
CPC ............. *H01L 23/16* (2013.01); *H01L 23/055* (2013.01); *H01L 23/562* (2013.01); *H01L 2224/16225* (2013.01); *H01L 2224/32225* (2013.01); *H01L 2224/32245* (2013.01); *H01L 2224/73204* (2013.01); *H01L 2224/73253* (2013.01); *H01L 2924/15311* (2013.01); *H01L 2924/3511* (2013.01)
USPC ...... 361/710; 361/679.54; 361/707; 361/715; 438/108; 438/122; 257/706; 257/712

(58) Field of Classification Search
USPC ....... 361/676–677, 679.46–679.54, 361/688–722, 752, 760–761, 831
See application file for complete search history.

(56) References Cited

U.S. PATENT DOCUMENTS

| | | | | |
|---|---|---|---|---|
| 5,970,319 | A * | 10/1999 | Banks et al. | 438/115 |
| 6,608,283 | B2 * | 8/2003 | Liu et al. | 219/121.85 |
| 7,791,189 | B2 * | 9/2010 | Zhao et al. | 257/710 |
| 8,013,438 | B2 * | 9/2011 | Luan et al. | 257/707 |
| 2005/0121775 | A1 | 6/2005 | Fitzgerald et al. | |
| 2006/0126309 | A1 * | 6/2006 | Bolle et al. | 361/719 |
| 2006/0208356 | A1 * | 9/2006 | Yamano et al. | 257/734 |
| 2010/0046172 | A1 * | 2/2010 | Taylor | 361/710 |
| 2010/0276799 | A1 * | 11/2010 | Heng et al. | 257/704 |

OTHER PUBLICATIONS

Chong, D., et al., "Reliability Analyses for New Improved High Performance Flip Chip BGA Packages," 2003 Electronics Packaging Technology Conference, IEEE, pp. 695-700.

Too, S., et al., "Effects of Organic Package Warpage on Micorprocessor Thermal Perfromance," 2007 Electronic Components and Technology Conference, IEEE, pp. 748-754.

Xiong, B., et al., "Warpage Improvement for Large Die Flip Chip Package," 2009 11th Electronics Packaging Technology Conference, IEEE, pp. 40-43.

* cited by examiner

*Primary Examiner* — Courtney Smith
(74) *Attorney, Agent, or Firm* — Slater & Matsil, L.L.P.

(57) ABSTRACT

In a package structure, a stiffener ring is over and bonded to a top surface of a first package component. A second package component is over and bonded to the top surface of the first package component, and is encircled by the stiffener ring. A metal lid is over and bonded to the stiffener ring. The metal lid has a through-opening.

20 Claims, 3 Drawing Sheets

LID DESIGN FOR RELIABILITY ENHANCEMENT IN FLIP CHIP PACKAGE

BACKGROUND

In the packaging of integrated circuits, particular flip chip packaging, warpage and stress are generated due to the mismatch in Coefficients of Thermal Expansion (CTEs) between different materials and different package components. The warpage and stress are major concerns in the improvement in the reliability of package structures. The current solution for reducing the warpage is to bond stiffener rings on package components such as package substrates. Metal lids are also bonded to the stiffener ring.

Although the stiffener rings can reduce the warpage of the package substrates, the resulting packages will be constrained by the stiffener rings, resulting in higher interfacial stresses for the package components, for example, the solder bumps and the dies. In the reliability tests in which the package structures experience multiple cycles of cooling and heating processes, the stresses may cause bump cracks, which indicate the reliability problems in the package structures.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel package structure is provided in accordance with an embodiment. The intermediate stages of manufacturing various embodiments are illustrated. The variations and the operation of the embodiment are discussed. Throughout the various views and illustrative embodiments, like reference numbers are used to designate like elements.

Figure 1:
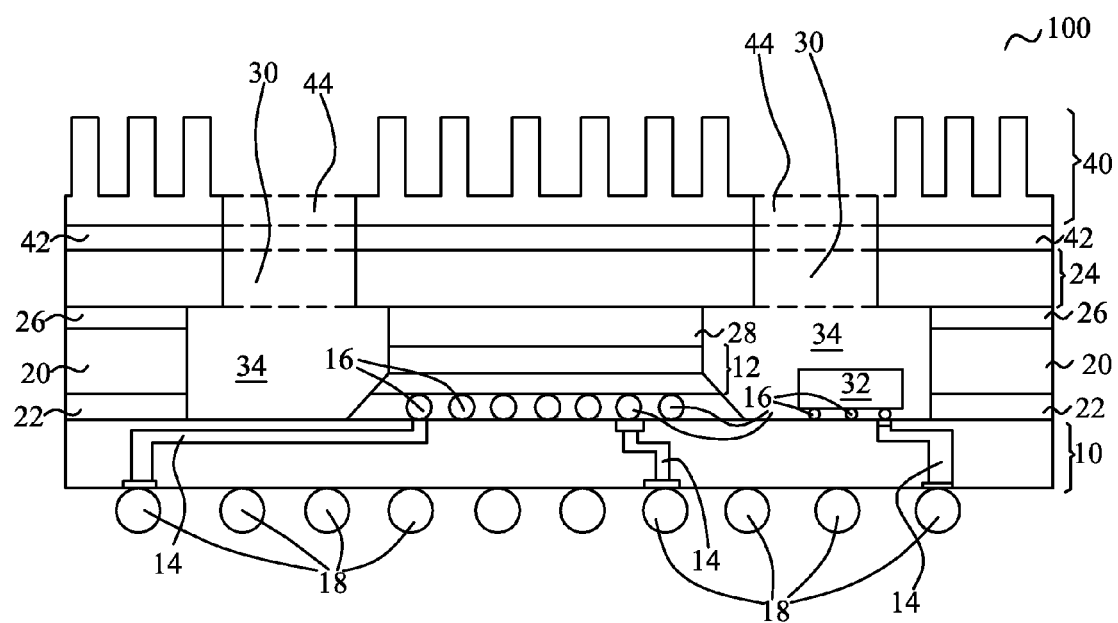
FIG. 1 illustrates a cross-sectional view of a package structure comprising a metal lid having through-openings.

FIG. 1 illustrates a cross-sectional view of package structure 100 in accordance with an embodiment. Package structure 100 includes package component 10, and package component 12 over, and bonded to the top surface of, package component 10. In an embodiment, package component 10 is a package substrate (and hence is alternatively referred to as package substrate 10 hereinafter). Metal connection lines/vias 14 are formed in package component 10 and electrically connecting metal bumps 16 on one side of package substrate 10 to metal bumps 18 on the opposite side of package substrate 10. Metal bumps 18 may also be ball grid array (BGA) balls, and may be used to bond package substrate 10 to a printed circuit board (PCB, not shown), for example. Package component 10 may be free from active devices such as transistors formed therein, and may, or may not, have passive devices (not shown) formed therein. In alternative embodiments, package component 10 may be a PCB, an interposer, a device die, or the like.

Package component 12 may be a device die including active devices (not shown) formed therein. Alternatively, package component 12 may be an interposer including metal connections (not shown) routed from one side to the opposite side of the interposer. In the embodiments wherein package component 12 is an interposer, package component 12 may be free from active devices such as transistors (not shown) formed therein, and may, or may not, include passive devices (not shown) formed therein. Furthermore, one or a plurality of device dies (not shown), may be bonded to the top surface of package component 12 when package component 12 is an interposer. In the following discussed exemplary embodiments, package component 12 is also referred to as device die 12.

In an embodiment, stiffener ring 20 is placed over package component 10, and is bonded to the top surface of package component 10 through adhesive 22. Stiffener ring 20 may be formed of a metallic material, although it may also be formed of a material (such as a ceramic) having a high Young's module. Further, lid 24 is placed over, and bonded to, package component 12 and/or stiffener ring 20. Lid 24 may have a flat top surface. Lid 24 may be formed of a homogeneous material throughout, which means all parts of lid 24 are formed of the same material. In an embodiment, lid 24 is a metal lid (and hence is referred to as metal lid 24 hereinafter) comprising copper, for example, although other metals or metal alloys such as aluminum or aluminum alloys may also be used. Adhesive 26 may be used to join stiffener ring 20 to metal lid 24, and thermal interface material (TIM) 28 is used to join lid 24 and package component 12. TIM 28 has a high thermal conductivity. Accordingly, the heat generated in device die 12 may dissipate to metal lid 24, and then dissipate to the external environment.

There may be one or a plurality of devices bonded to package component 10 and encircled by stiffener ring 20. For example, additional devices such as passive devices including capacitors, baluns, devices dies, and the like (as illustrated as device 32), may also be bonded to package component 10, and may be encircled by stiffener ring 20.

Metal lid 24 includes one or a plurality of through-openings 30 therein. In an embodiment, through-openings 30 are formed in locations not vertically overlapping device die 12. Accordingly, there is no through-opening 30 formed directly over TIM 28. Optionally, heat sink 40 is bonded to metal lid 24 through TIM 42. Heat sink 40 may include through-openings 44 therein. In an embodiment, through-openings 30 and 44 are vertically overlapped to allow cooling air to cycle between space 34 and the external environment external to space 34, wherein space 34 is the space defined by package substrate 10, stiffener ring 20, and metal lid 24.

Figure 2:
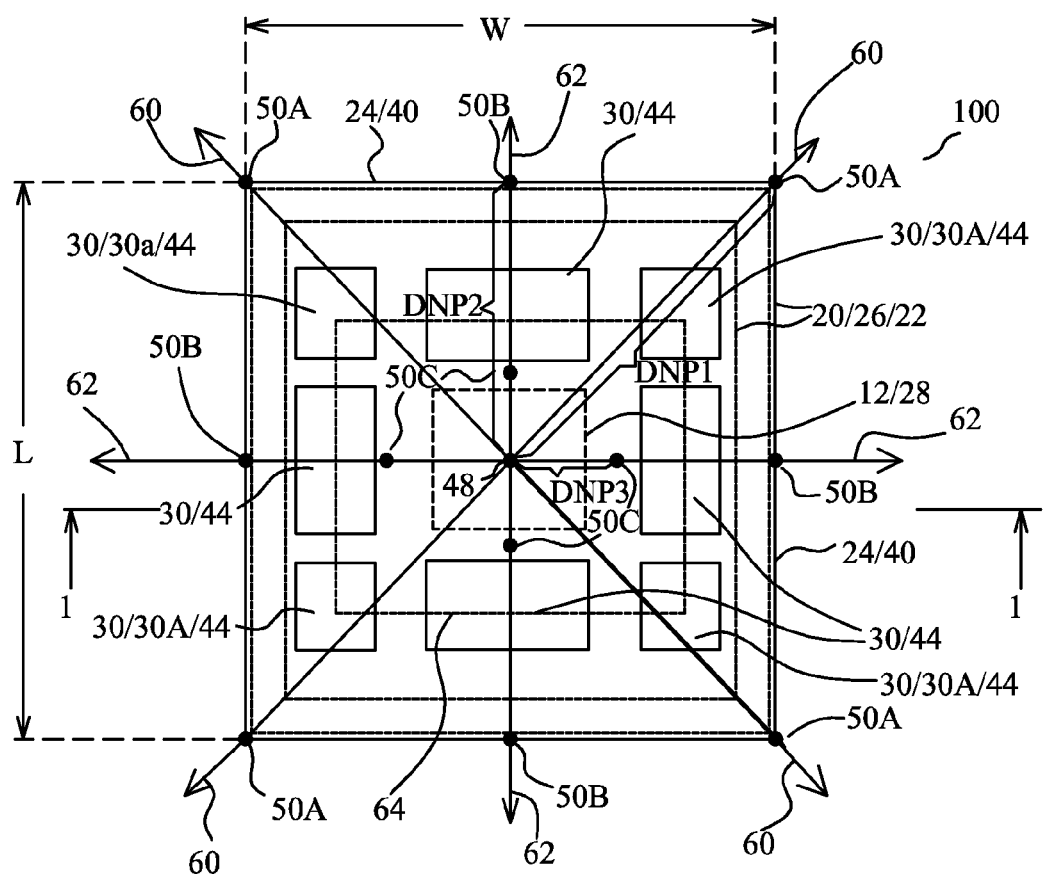
FIGS. 2 and 3 are top views of package structures comprising metal lids having through-openings formed therein, wherein the through-openings in FIGS. 2 and 3 have different designs.

FIG. 2 illustrates a top view of the package structure as shown in FIG. 1, wherein the cross-sectional view shown in FIG. 1 is obtained from the plane crossing 1-1 in FIG. 2. In the exemplary embodiment as shown in FIG. 2, heat sink 40, if used, may overlap metal lid 24, and through-openings 30 and 44 may overlap each other, although they can also misalign with each other slightly. Dotted lines are used to indicate the locations of stiffener ring 20, adhesives 22 and 26, and device die 12 and TIM 28.

It is realized that metal lid 24 has a Coefficient of Thermal Expansion (CTE) different from the CTEs of the underling materials such as TIM 28 and device die 12. The mismatch in the CTEs results in stresses to be generated in package components 10, 12, and the like. Metal lid 24 may have a neutral stress point, which may be, for example, center point 48 (in the top view) in the illustrated embodiment. At the neutral stress point, the stress is neutralized by the stresses in all directions. Accordingly, the respective bumps (such as bumps 16 as in FIG. 1) and other materials that are directly under neutral stress point 48 suffer from a small stress, which may be a substantially neutral stress (zero stress). The stress applied to other parts of the package components are related to their distances (referred to as Distance to Neutral Point (DNP)) from the neutral stress point. Generally, the greater the DNP of a point is, the greater the stress at the point. For example, if no openings 30 are formed in metal lid 24, then DNP1 of corner points 50A are greater than DNP2 of points 50B, which are edge points of metal lid 24. Accordingly, the stresses at corner points 50A may be greater than the stresses at the edge points 50B. Furthermore, if no openings 30 are formed in metal lid 24, then DNP2 of edge points 50B are greater than DNP3 of inner points 50C. Accordingly, the stresses at edge points 50B are greater than the stresses at inner points 50C. The Stresses in metal lid 24 are also transferred to underlying package components. Therefore, reducing the stresses in metal lid 24 also results in the reduction in the stresses of the underlying package components. In the embodiments, through-openings 30 are formed to reduce the stress in metal lid 24.

There are various ways of forming through-openings 30 in metal lid 24, and through-openings 30 may be formed at the locations that have a significant effect in reducing the DNPs. For example, through-openings 30 may be formed so that all the stress paths from neutral stress point 48 to corner points 50A are cut and shortened. Furthermore, through-openings 30 may be formed so that no stress path is equal to or greater than L/2 and W/2, with L and W being the length and width, respectively, of metal lid 24, wherein width W is equal to or smaller than length L.

Figure 3:
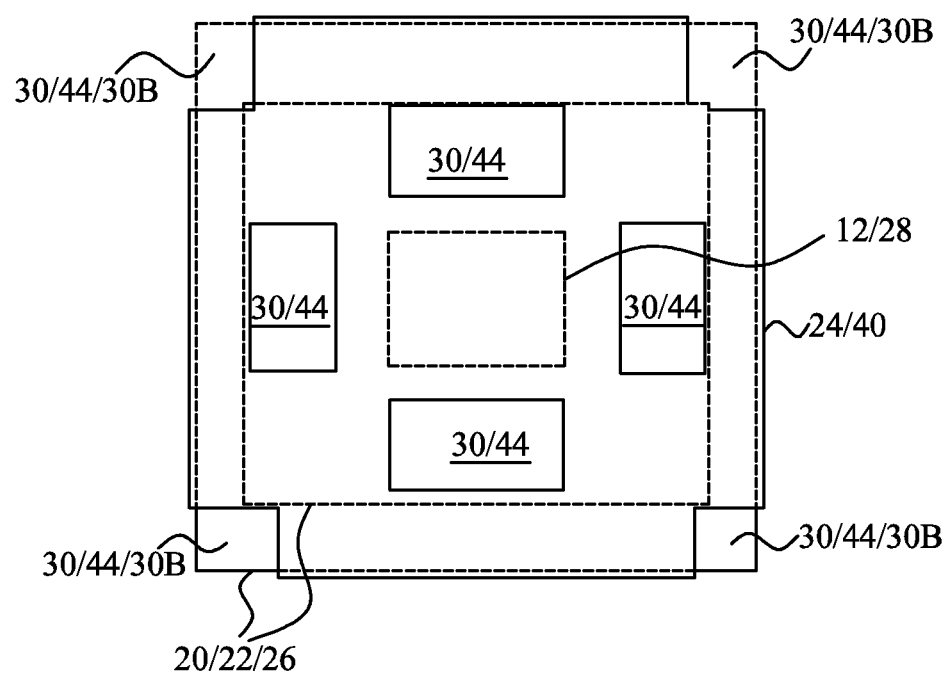

By reducing the DNPs, the magnitudes of the stresses generated in the package components are reduced, partially due to the removal of the material (of metal lid 24) that causes the stress. For example, the metal that otherwise would be in through-openings 30 is removed, resulting in the reduction in the stresses. FIGS. 2 and 3 illustrate two exemplary schemes for forming through-openings 30. One skilled in the art will realize that there are various other ways of forming through-openings 30 when the teaching of the present disclosure is applied. In both FIGS. 2 and 3, through-openings 30 are formed to cut and shorten stress paths 60, which extend in the directions pointing from neutral stress center 48 to corner points 50A. Furthermore, through-openings 30 may be formed to cut and shorten stress paths 62, which are in the directions extending from neutral stress center 48 to perpendicular to the edges of metal lid 24. In an exemplary embodiment as shown in FIG. 2, the centers of through-openings 30 (denoted as 30A) are aligned to rectangle 64. In alternative embodiments as shown in FIG. 3, the centers of through-openings 30 (denoted as 30B) are right at the corners, and may vertically overlap stiffener ring 20. In the embodiments as shown in FIG. 3, through-openings 30B are formed by removing the corner portions of metal lid 24. In some embodiments, an entirety or substantially an entirety of through-openings 30B overlaps stiffener ring 20, and no portion of through-openings 30B extends to directly over space 34 (refer to FIG. 1), which is encircled by stiffener ring 20.

With through-openings 30 in metal lid 24 overlapping through-openings 44 in heat sink 40, air can be cycled through through-openings 30/44. Therefore, the heat generated by device die 12 may be dissipated through both conduction-type and convection-type heat dissipation. Referring back to FIG. 1, for the conduction-type heat dissipation, the heat generated in device 12 is dissipated through TIM 28, metal lid 24, TIM 42, and to heat sink 40. For the convection-type heat dissipation, air goes into and out of space 34 to bring away the heat in space 34. This is particularly helpful for dissipating the heat generated by device(s) 32, which heat does not have an effective conduction-type heat dissipation path.

As shown in FIGS. 2 and 3, there may be various ways of designing and customizing through-openings 30. The design regarding the locations and the sizes of through-openings 30 may be considered at the system level so that an effective scheme is selected, and the combined effect of the conduction-type and convection-type heat dissipation is maximized. Furthermore, the effect of reducing the DNPs is also combined into the design of through-openings 30 so that the overall stresses to package components are reduced. In addition, by forming through-openings 30, the amount of the material used by metal lid 24 is reduced. In some embodiments, the material may be reduced by about 36 percent.

In accordance with embodiments, in a package structure, a stiffener ring is over and bonded to a top surface of a first package component. A second package component is over and bonded to the top surface of the first package component, and is encircled by the stiffener ring. A metal lid is over and bonded to the stiffener ring. The metal lid has a through-opening.

In accordance with other embodiments, a package structure includes a package substrate; and a stiffener ring over and bonded to a top surface of the package substrate. A device die is over and bonded to the top surface of the package substrate through flip chip bonding, wherein the device die is encircled by the stiffener ring. A metal lid has a flat top surface, and is disposed over and bonded to the stiffener ring. The metal lid is formed of a homogeneous material, and comprises a plurality of through-openings, wherein substantially no through-opening is formed over and vertically overlapping the device die. A thermal interface material is disposed between and bonding the device die and the metal lid.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package structure comprising:
 a first package component;
 a stiffener ring over and bonded to a top surface of the first package component;

a second package component over and bonded to the top surface of the first package component, wherein the second package component is encircled by the stiffener ring;

a metal lid over and bonded to the stiffener ring, wherein the metal lid comprises a plurality of openings, wherein the metal lid has a top-view shape of a rectangle having a width and a length, wherein no Distance to Neutral Point (DNP) between any point of the metal lid and a center of the metal lid is greater than a half of the width and a half of the length, and wherein no DNP has a stress path passing through any of the plurality of openings in the metal lid;

a heat sink over the metal lid, wherein the heat sink comprises an additional through-opening vertically overlapping one of the plurality of through-openings in the metal lid; and a thermal interface material between and joining the heat sink and the metal lid.

2. The package structure of claim 1, wherein the plurality of openings is over and vertically overlapping at least a part of a region encircled by the stiffener ring.

3. The package structure of claim 2 further comprising a thermal interface material, wherein the second package component is bonded to the metal lid through the thermal interface material, and wherein no through-opening is formed over and vertically overlapping the second package component.

4. The package structure of claim 1, wherein the first and the second package components are selected from the group consisting essentially of a device die, a printed circuit board (PCB), an interposer, a package substrate, and combinations thereof.

5. The package structure of claim 1, wherein the metal lid has a flat top surface.

6. The package structure of claim 1, wherein the metal lid comprises a plurality of through-openings.

7. A package structure comprising:
a package substrate;
a stiffener ring over and bonded to a top surface of the package substrate;
a device die over and bonded to the top surface of the package substrate through flip chip bonding, wherein the device die is encircled by the stiffener ring;
a metal lid having a flat top surface over and bonded to the stiffener ring, wherein the metal lid is formed of a homogeneous material, and wherein the metal lid comprises a first plurality of through-openings, and wherein substantially no through-opening in the metal lid is formed over and vertically overlapping the device die;
a first thermal interface material between and bonding the device die and the metal lid;
a heat sink over the metal lid, wherein the heat sink comprises a second plurality of through-openings vertically overlapping the first plurality of through-openings; and
a second thermal interface material between and joining the heat sink and the metal lid.

8. The package structure of claim 7, wherein centers of the first plurality of through-openings are aligned to a rectangle encircling a portion of the metal lid, with the portion being over and vertically overlapping the device die.

9. The package structure of claim 7, wherein in a top view of the package structure, no Distance to Neutral Point (DNP) between any point of the metal lid and a neutral stress center of the metal lid is greater than a half of a width of the metal lid.

10. The package structure of claim 7, wherein one of the first plurality of through-openings is formed at a corner of the metal lid and vertically overlapping a portion of the stiffener ring.

11. The package structure of claim 10, wherein substantially no portion of the one of the first plurality of through-openings extends to directly over the region encircled by the stiffener ring.

12. A method comprising:
bonding a device die over a package substrate;
bonding a stiffener ring over the package substrate and encircling the device die;
bonding a metal lid to the device die and the stiffener ring, wherein the metal lid comprises a substantially flat top surface, and wherein the metal lid comprises a through-opening, with a space encircled by the stiffener ring exposed through the through-opening; and
bonding a heat sink to the metal lid through a thermal interface material, wherein the heat sink comprises a through-opening vertically overlapping the through-opening in the metal lid.

13. The method of claim 12, wherein no through-opening in the metal lid is over and vertically overlapping the device die.

14. The method of claim 12, wherein the metal lid is bonded to the device die through a thermal interface material, and wherein the metal lid is bonded to the stiffener ring through an adhesive.

15. The package structure of claim 1, wherein the metal lid has the corner of the metal lid removed or a center of the metal lid removed.

16. The package structure of claim 15, wherein the metal lid has the corner of the metal lid removed, and wherein the plurality of openings vertically overlaps a portion of the stiffener ring.

17. The package structure of claim 16, wherein substantially no portion of the plurality of openings extends to directly over the space encircled by the stiffener ring.

18. The package structure of claim 15, wherein the metal lid has the center of the metal lid removed.

19. A package structure comprising:
a first package component;
a stiffener ring over and bonded to a top surface of the first package component;
a second package component over and bonded to the top surface of the first package component, wherein the second package component is encircled by the stiffener ring; and
a metal lid over and bonded to the stiffener ring, wherein the metal lid comprises a plurality of openings, with one of the plurality openings vertically overlapping a portion of the stiffener ring, wherein the metal lid has a top-view shape of a rectangle with a corner of the rectangle removed, wherein the metal lid has a width and a length, wherein no Distance to Neutral Point (DNP) between any point of the metal lid and a center of the metal lid is greater than a half of the width and a half of the length, and wherein no DNP has a stress path passing through any of the plurality of openings in the metal lid.

20. The package structure of claim 19, wherein substantially no portion of the plurality of openings extends to directly over the space encircled by the stiffener ring.

* * * * *